United States Patent [19]

Kurokawa et al.

[11] Patent Number: 5,105,556
[45] Date of Patent: Apr. 21, 1992

[54] VAPOR WASHING PROCESS AND APPARATUS

[75] Inventors: Hideaki Kurokawa, Hitachi; Katsuya Ebara, Mito; Sankichi Takahashi; Harumi Matsuzaki, both of Hitachi; Hiroaki Yoda, Tsuchiura; Takahisa Nitta, Fuchu; Isao Ôkouchi; Yukio Hishinuma, both of Hitachi, all of Japan

[73] Assignee: Hitachi, Ltd., Tokyo, Japan

[21] Appl. No.: 230,155

[22] Filed: Aug. 9, 1988

[30] Foreign Application Priority Data

Aug. 12, 1987 [JP] Japan .................. 62-199769
Aug. 14, 1987 [JP] Japan .................. 62-201736

[51] Int. Cl.⁵ .............................................. F26B 7/00
[52] U.S. Cl. ................................. 34/12; 34/73; 134/11
[58] Field of Search ................ 34/73, 70, 68, 78, 12, 34/13, 36, 37, 32; 210/640; 55/158, 183, 185, 474; 134/11, 10, 12, 109, 31, 2, 20

[56] References Cited

U.S. PATENT DOCUMENTS

| 3,340,186 | 9/1967 | Weyl ........................... 210/22 |
| 3,878,054 | 4/1975 | Rodgers ...................... 203/11 |
| 4,079,522 | 3/1978 | Ham ............................. 134/11 X |
| 4,612,712 | 9/1986 | Pescatore et al. ......... 34/78 X |
| 4,879,041 | 11/1989 | Kurokawa et al. ......... 210/640 |

FOREIGN PATENT DOCUMENTS

61-138582  6/1986  Japan .
61-138583  6/1986  Japan .
61-174982  8/1986  Japan .
61-200885  9/1986  Japan .

OTHER PUBLICATIONS

Moreau et al, Wafer Cleaner System, IBM Technical Disclosure Bulletin vol. 14, No. 10, Mar. 1972.
"Ultra-Pure Water High Purity Chemical Substance Supply System Proceeding" Second Symposium on Ultra LSI Ultra-Clean Technology Symposium No.2, pp. 399-419.

*Primary Examiner*—Henry A. Bennet
*Attorney, Agent, or Firm*—Fay, Sharpe, Beall, Fagan, Minnich & McKee

[57] ABSTRACT

Vapor is separated from mist accompanying the vapor by passing the vapor through a porous membrane. The vapor having passed through the membrane is brought into contact with an object to be washed and condenses thereon, whereby the object is washed.

38 Claims, 4 Drawing Sheets

VAPOR WASHING PROCESS AND APPARATUS

BACKGROUND OF THE INVENTION

The present invention relates to a process of and apparatus for washing a semiconductor wafer, various optical or electric parts, jigs for manufacturing those, etc. with vapor and, more particularly, to a vapor washing process and apparatus in which the vapor used for the washing can be made highly pure so that the washing effect is excellent.

In recent years, the degree of integration of semiconductors is markedly increasing, whereby higher cleanliness is required of the surface of semiconductor a wafer. Wafer washing-drying technique is described in detail in "Ultra-pure Water-High Purity Chemical Substance Supply System Proceeding" of the second symposium on Ultra LSI Ultra-Clean Technology, pages 399–419, which symposium was held at Tokyo Hatsumei-Kaikan hall under the auspices of a society for the study of basic semiconductor technology.

As is apparent from the above-mentioned papers, generally, semiconductor wafers are washed with a solvent (triclene, acetone $H_2O_2$-$NH_4OH$ mixture, etc.) to remove fatty substances adhering to a substrate surface, and with acid-alkali (HF, $H_2O_2$-$NH_4OH$, HCl-$H_2O_2$ mixture) to wash away metallic polluting substances successively and finally with ultra-pure water, after which drops of the ultra-pure water are removed and the wafer is sent to the next step. The purity of the ultra-pure water used in the process is very high; the specific resistance is kept at 18 M $\Omega$·cm or above, TOC 50 ppb at or below, and the fine particles at less than 0.1 $\mu$m 50 particles/ml. Nevertheless defects appear unless the drops are sufficiently removed, so that various studies have been undertaken on the method of removing water drops.

In conventional water drop removing methods, there is a drying method using hot air, a method of rotating a substrate after washing with water and mechanically dispersing water drops by centrifugal force caused by the rotation, and a method of using vapor of organic solvent such as isopropyl alcohol (IPA), replacing water by the solvent and then drying the solvent. These methods are termed a hot air drying method, a spin drying method, an IPA vapor drying method, respectively, and are used in conventional wafer washing processes.

At present, the washing of a chemical solution adhered on the wafer with ultra-pure water is effected by filling a vessel with the ultra-pure water, dipping the wafer in the ultra-pure water while overflowing the water and then replacing the chemical solution by the ultra-pure water. Further, recently, a washing method using steam which is produced by heating and evaporating the water has been reported.

In the washing of a semiconductor wafer, etc., it is desired that all of the above-described washing-drying techniques leave no impurities, for example, fine particles and soluble substances contained in solution on the surface of an object to be treated (washed object). However, the above-mentioned techniques have an unsatisfactory point, therefore, the impurities can be left on the surface. Namely, the hot air drying method evaporates water drops adhered on the surface of the substrate by hot air, so that fine particles and insoluble components in the water drops can be deposited, and finally impurities can be left on the substrate. In the spin drying method, it is impossible to remove all of the water drops, therefore, impurities can be left on the surface of the washed wafer in a similar manner to the hot air drying method when the surface, particularly, water drops in fine grooves on the surface of the wafer are dried. Further, although the IPA vapor drying method is less sensitive to the influence of impurities in the ultra-pure water since the water that is used in the washing is replaced with the IPA, it has the problem of adhesion of impurities in the IPA due to the dispersion of IPA mist and the problem of replacement between the IPA and the water. Further, in the step of washing a wafer having a chemical solution with ultra-pure water prior to a drying step, a lot of ultra-pure water is over flown, and the chemical solution of the wafer dipped in the water is replaced by the ultra-pure water, so that a lot of water is required and impurities are likely to remain on the surface as the degree of integration increases because it is not easy to achieve a sufficient washing effect in the fine grooves.

The vapor washing method also has the problem that the impurities in the vapor adhere to the surface of the object being washed and remain there.

Other prior arts concerning washing methods are disclosed Japanese Patent Laid-Open Nos. 61-174982, 61-138582, 61-138583, 61-200885, etc. for example.

SUMMARY OF THE INVENTION

An object of the present invention is to provide a washing process that reduces the amount of impurities that remain on an object to be treated as compared with a conventional method of dipping an object to be treated in ultra-pure water and as compared with a conventional vapor washing method.

Another object of the present invention is to provide a washing apparatus for practicing the above washing process.

A vapor washing process according to the present invention comprises the steps of vaporizing a washing liquid through heating to form a vapor; passing the vapor through a porous membrane to thereby remove the mist accompanying the vapor; and then contacting the vapor with an object to be treated.

The vapor that contacts with the object to be treated has latent heat thereof lost by the object and condenses on the surface of the object thereby to wash the object.

The present invention is based on the conception that when vapor, which is obtained by vaporizing a washing liquid has the mist accompanying the vapor, removed fine particles of unvolatile substances are not contained therein or are very small if present, therefore, a washing process with this type of vapor reduces remarkably an amount of impurities remaining on the surface of the object being washed. The mist accompanying the vapor can be removed by passing the vapor through a hydrophobic porous membrane in the case of the vapor being steam, and by passing the vapor through a hydrophilic porous membrane in the case of the vapor being an organic solvent which is insoluble to water.

In the case of washing an object with condensed water which is made of steam that has passed through a porous membrane and condensed as mentioned above, some of the components of the container are dissolved into the condensed water, so that the purity is detracted as compared with washing the object with vapor by direct contact between the vapor and the object.

In the conventional washing method in which an object to be treated is caused to contacted with ultra-pure water, it is not intended that the fine particles contained in the ultra-pure water be removed and it is impossible to do so. In the conventional vapor washing method also, it is not intended that the impurities contained in mist accompanying the vapor be removed.

DETAILED DESCRIPTION OF THE INVENTION

Figure 1:
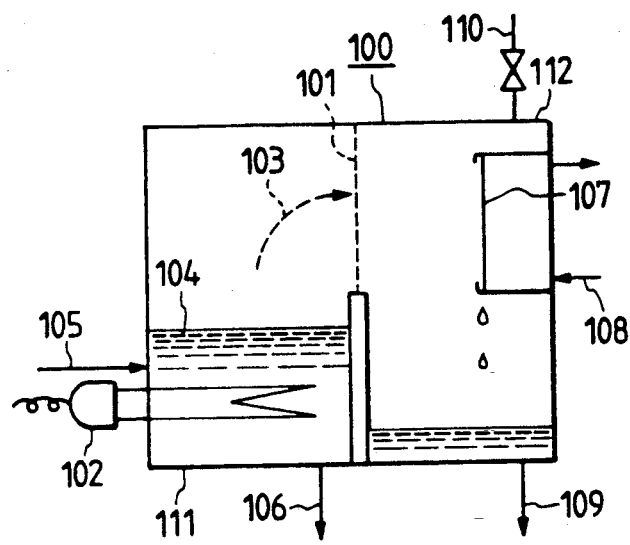
FIG. 1 is a schematic diagram of a washing apparatus of an embodiment of the present invention.

The present invention resides in a vapor washing process in which vapor of the washing liquid from which mist is removed by a porous membrane is brought into contact with and condenses on the surface of an object to be treated. As a result, the impurities adhered on the object are washed away by the condensed water.

As the washing liquid, water, an organic solvent which is insoluble to water, etc. can be used.

As the porous membrane, it is desirable to use a hydrophobic porous membrane when water is used as the washing liquid. In case an organic solvent insoluble to water is used as the washing liquid, it is desirable to use a hydrophilic porous membrane.

The vapor washing process according to the present invention is applicable to a semiconductor wafer, various optical and electrical parts including an optical disc and a magnetic disc, jigs for manufacturing those, etc.

As for the water used for washing the semiconductor wafer with vapor, it is preferable to use ultra-pure water.

When the vapor washing process according to the present invention is applied for washing a semiconductor wafer, it is preferable to apply the vapor washing process to the semiconductor wafer immediately after chemical solution treatment or to the semiconductor wafer from which chemical solution is washed away by dipping it in ultra-pure water after chemical solution treatment. When the semiconductor wafer is dipped in the ultra-pure water to wash it, fine particles in the ultra-pure water may enter grooves of the semiconductor wafer and remain there. However, the remaining fine particles can be washed away by applying thereto the vapor washing process according to the present invention.

According to the present invention, for example, chemical substances adhered on the surface of a semiconductor wafer after washing off a chemical solution are replaced by steam having passed through a hydrophobic porous membrane and washed away. The hydrophobic porous membrane can remove completely the mist accompanying the steam, so that only the pure steam and volatile components such as organic substances, ammonia, $CO_2$ gas etc. contained in the raw water remain in the steam. Therefore, when the steam is condensed on the surface of the semiconductor wafer, all unvolatile components are removed, so that any impurities do not remain on the wafer surface after drying. In particular, when the wafer is dried by superheated steam from the same steam as used for washing of the object, the steam is subjected to a higher temperature than an evaporation temperature. Therefore, even if TOC components are liquefied, they are evaporated, and nothing is left on the wafer. Further, steam easily enters grooves of an object to be treated, and it is effective to wash fine parts of the object.

When steam for washing is condensed, an object to be treated takes in latent heat of the steam and rises in temperature. When the temperature of the object rises too high during the washing, the steam does not condense and the washing is interrupted. Therefore, it is desirable to forcibly cool the object to be treated so as to keep the surface of the object at a condensing temperature with respect to the steam during the washing. As a forcibly cooling method, for example, it is preferable to form a recirculation passage for coolant such as water in the base plate mounting the object to be treated and flow the coolant in the recirculation passage.

In the vapor washing process according to the present invention, a volatile component such as an organic substance, ammonia, $CO_2$ gas, etc. may be contained in the steam from which mist has been removed. Although a volatile substance is unlikely to remain on the surface of an object to be treated after the washing, it is better that such substance is not contained in the steam. As is mentioned above, it is desirable to remove the volatile substance beforehand. As a means therefor, it is desirable to provide a step of removing the volatile components by heating the washing liquid to evaporate them before passing through a porous membrane. By providing such a pretreatment of removing volatile components as mentioned above, an object to be treated can be washed with a high purity vapor which does not substantially contain volatile components and nonvolatile fine particles.

It is desirable to keep the surroundings of an object to be washed at a saturated state of vapor during the washing. Therefore, it is preferable to dispose the object in a closed chamber and extract an uncondensable gas from a part of the chamber during washing.

In the washing of a semiconductor wafer, when the degree of integration of LSI increases and the scale of pattern thereof is made small, water from steam that has entered grooves of the wafer and condensed there may not go out of the grooves due to surface tension. In such a case, it is desirable to repeat the washing several times or to wash the wafer under a depressurized state, thereby removing water drops from the grooves.

After the washing with vapor, usually a drying step proceeds. In the washing of semiconductor wafers, it is essential to provide the drying step as disclosed in the papers "Ultra-pure Water High Purity Water Chemical Substance Supply System Proceeding" page 411.

As is mentioned above, in the vapor washing according to the present invention, remaining impurities can be remarkably reduced, so that a conventional drying method such as hot air drying, spin drying, IPA vapor drying, etc. can be applied.

As a drying method after the vapor washing step according to the present invention, it is preferable to use superheated vapor which has passed through a hydrophobic porous membrane to dry.

The superheated vapor can be dry condensed liquid on the surface of an object to be treated. The superheated vapor can be easily produced by heating the vapor before and/or after passing through the porous membrane. The use of the superheated vapor enables the practice of washing and drying with the same washing liquid.

It is possible to effect both the washing step and the drying step by using only a superheated vapor.

In the case of drying with superheated vapor, since water is not easily to be separated, it is desirable to make it easy to separate the water by exhausting the chamber containing the object to be treated with a vacuum pump to depressurize the surroundings of the object, or by rotating the object in a manner similar to the spin drying method.

Further, in the case of a semiconductor wafer such as a Si wafer being contaminated with greasy or fatty substances, its native oxides such as native $SiO_2$ which is produced by contact with the atmosphere during production, handling of the wafer, etc., or in the wafer has very fine grooves or holes, it is preferable to provide the following pre- or post-treatment in addition to the above-mentioned vapor washing.

The pre- or post-treatment comprises contacting a contaminated wafer with a super critical fluid or a mixture of the super critical fluid and a reactive gas such as HF, HCl, to remove the contamination, and the drying the wafer by use of the super critical fluid.

The super critical gas has a density that is close to that of the liquid and a viscosity which is close to gas and is small. Since the viscosity of the super critical fluid is small, the super critical fluid can sufficiently contact the fine parts of a semiconductor wafer such as pattern grooves formed in the surface thereof, holes, etc., so that the washing can be effective. The large density of the super critical fluid is connected to a high solubility of the contamination into the fluid, in particular, organic substances can be extracted from the wafer, so that the super critical fluid is effective to remove greasy or fatty substances.

As material for a super critical fluid, inert gas such as $CO_2$, $N_2$ is the most suitable from a point of view of safety. The substance is the most suitable to remove greasy or fatty substances.

The Si-wafer is contaminated with native $SiO_2$ as mentioned above. In order to remove the native $SiO_2$, a reactive gas such as HF, HCl etc. to which the oxide can be soluble is mixed with the super critical fluid, and the mixture contacts the wafer, whereby the contamination is removed.

Addition of $H_2O$ to the super critical fluid or the mixture of the super critical fluid and the inert gas raises an affinity between the wafer and the fluid, and the solubility and diffusion of contamination into the super critical fluid can be increased so that the removal is enhanced.

By contacting the wafer with the super critical fluid without the addition of the reactive gas and $H_2O$, $H_2O$ adhered on the wafer is absorbed in the super critical fluid and the wafer can be dried.

A reactive gas such as HF, HCl etc. is corrosive to many kinds of metal. The super critical fluid and the wafer during the washing can be contaminated with the substance produced by the corrosion of the metal. Therefore, it is desirable to prevent the apparatus from being corroded by forming a thin film of quartze, silicon, fluorine resin or the like that is insoluble to the reactive substances on the inner walls of the structural parts of the apparatus by a method of coating, plasma CVD, a polymerization, etc.

Further, in case of $CO_2$ being used for super critical fluid, since the critical point of $CO_2$ is at a temperature of 31° C., and a pressure of 73 atm, an extraction speed of the contamination can be changed by changing the temperature and pressure to a proper value within a range above the above critical point. The contamination can be separated from the contaminated super critical fluid by changing the super critical fluid into a usual gaseous state through depressurization or reduction in its temperature.

Next, examples of the invention will be illustrated with reference to the accompanying drawings. The present invention is by no means limited by these examples.

EXAMPLE 1

FIG. 1 shows a basic embodiment of a vapor washing apparatus according to the present invention. An explanation is made in a case where water is used as a washing liquid in the washing apparatus.

A vapor washing apparatus 100 according to the present invention comprises a steam generation section 111, a condensing and washing section 112 and a hydrophobic porous membrane 101 disposed therebetween. Raw water 104 is introduced into the stream generation section 111 through an entrance 105, and heated there by a heater 102 to evaporate it. Generated steam 103 passes through the hydrophobic porous membrane 101, and mist accompanying the steam 103 is separated from the steam by the membrane 101. The steam having passed through the membrane 101 condenses on an object 107 to be washed (an object to be treated). The object 107 is washed with the condensed water. The object 107 may rise in temperature, so that the steam may not be condensed on the object 107. Therefore, it is desirable that a backside of the object 107 be cooled by cooling water in a cooling pipe 108, and by keeping the object surface at a temperature not more than 100° C., so that the steam can be condensed. Water contaminated by the washing is discharged through a drain port 109. Further, since the interior of the condensing and washing section 112 is most desirably to be kept at a saturated state of the steam, it is desirable to extract the uncondensable gas from an extraction port 110.

According to this example, the washing can be effected with the steam passed through the hydrophobic porous membrane 101, so that an effective washing can be carried out with a relatively small amount of water and the washing effect is very high because a very small amount of impurities remaining on the surface of the object after drying. A reference numeral 106 denotes an exhaust port of the raw washing water.

EXAMPLE 2

Figure 2:
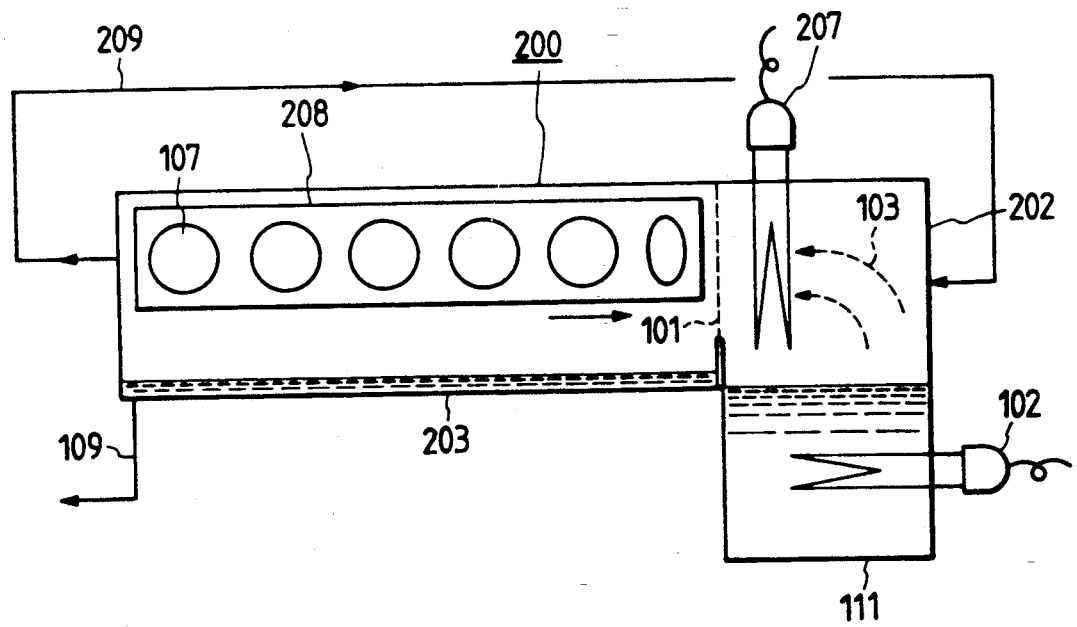
FIG. 2 is a schematic diagram of a washing apparatus of another embodiment of the present invention.

FIG. 2 shows an example of a vapor washing apparatus having a superheated steam drying apparatus.

The vapor washing apparatus 200 comprises a steam generation section 111, a steam superheating section 202, a washing-drying section 203 and a hydrophobic porous membrane 101 disposed between the steam superheating section 202 and the washing-drying section 203. Raw water in the steam generation section 111 is heated by a heater 102 to generate steam. The steam 102 is further heated by a superheating heater 207 in the steam superheating section 202 to turn it into superheated steam. The superheated steam passes through a hydrophobic porous membrane 101 and is sent to the washing-drying section 203 in which objects 107 to be washed are arranged on a movable washer 208. Meanwhile water drops adhered to the surface of the objects 107 turn into steam and the saturated steam washes the objects 107. The movable washer 208 is moved gradually toward the membrane 101 during the washing, and the objects are first subjected to a washing step, next to a drying step, and then are sent out of the apparatus. Extra steam is returned to the steam generating section 202 through a recirculation line 209. Condensed water used for washing is discharged out of the apparatus through a drain port 109.

According to this example, the washing and drying of the objects 107 are effected at the same time in a clean steam atmosphere. Therefore, the amount of water used is reduced and the objects 107 are effectively washed.

EXAMPLE 3

Figure 3:
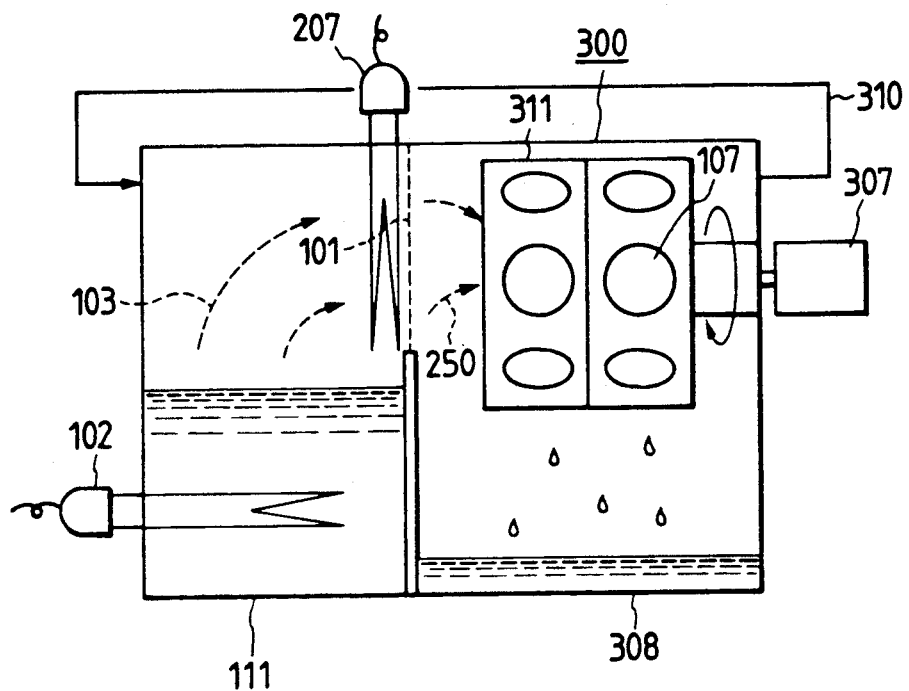
FIG. 3 is a schematic diagram of a washing apparatus of another embodiment of the present invention.

FIG. 3 shows a vapor washing apparatus provided with a spinning device for effecting a spin washing method.

The vapor washing apparatus 300 comprises a steam generation section 111, a washing-drying section 308, and a hydrophobic porous membrane 101 provided therebetween.

In this example, the washing and drying are repeatedly operated in a batch manner. First, in the washing step, raw water is heated by a heater 102 to evaporate it. The generated steam 103 is then filtered by the porous membrane 101, and sent to the washing-drying section 308.

In the washing-drying section 308, a spinner 311 is provided. Objects 107 to be washed are mounted on the surface of spinner 311 and rotated by a motor 307 in a direction indicated by an arrow. The steam condenses on the objects 107 and the condensed water is removed together with impurities by centrifugal force from the surfaces of the objects 107. The surfaces of the objects 107 are washed again by newly contacted steam. After the objects 107 are washed sufficiently in the above-mentioned manner, they are transferred to a drying step. In the drying step, the steam 103 generated in the steam generation section 111 is further heated by a heater 207 for superheating it and then sent to the washing-drying section 308. In this step also, the spinner 311 is rotated and the objects 107 are dried with the superheated steam. Steam which has been saturated is sent to the steam generation section 111 through a recirculation line 310. If a hydrophobic membrane is provided at an inlet of the recirculation line 310, mist generated by the spinner can be removed, so that the drying is more effective. By providing the spinner 311, water drops in fine grooves in the surface of the object to be washed also can be removed, so that the washing effect can be enhanced.

Further, in FIG. 3, the heater 207 can be provided on the washing-drying section side.

EXAMPLE 4

Figure 4:
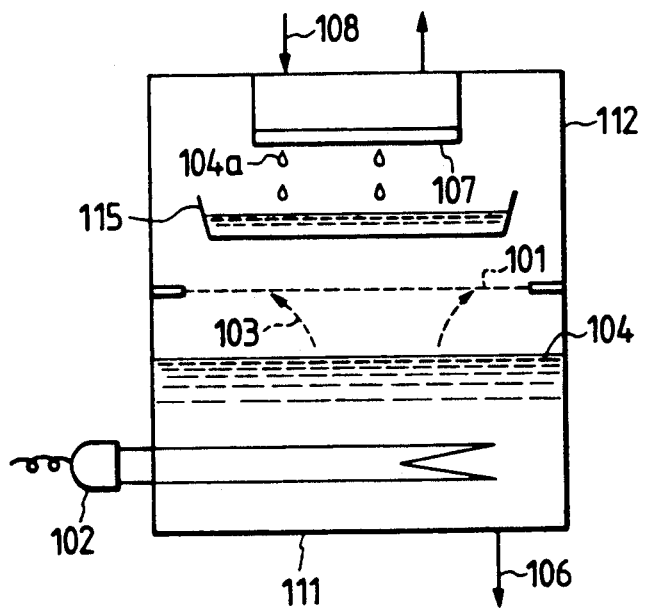
FIG. 4 is a schematic diagram of a modification of the washing apparatus shown in FIG. 1.

FIG. 4 shows a modification of the vapor washing apparatus shown in FIG. 1.

In a vapor washing apparatus in this example, the condensation washing section 112 is disposed over the steam generation section 111, and the hydrophobic porous membrane 101 partitions both the section 112 and 111. Steam 103 generated by heating and evaporating raw water 104 by the heater 102 and evaporation thereof permeates the porous membrane 101, whereby mist accompanying the steam 103 is removed to produce high purity steam. The high purity steam contacts an object 107 to be washed and then condenses. Washing of the object 107 is effected by the condensed water. Condensed water 104a that drops from the object 107 is reserved in a tray 115.

This example provides a compact structure as compared with the apparatus of FIG. 1.

EXAMPLE 5

An explanation is made of an example, wherein means for removing the volatile components from the washing water is provided in a previous stage of a steam generating section.

Figure 5:
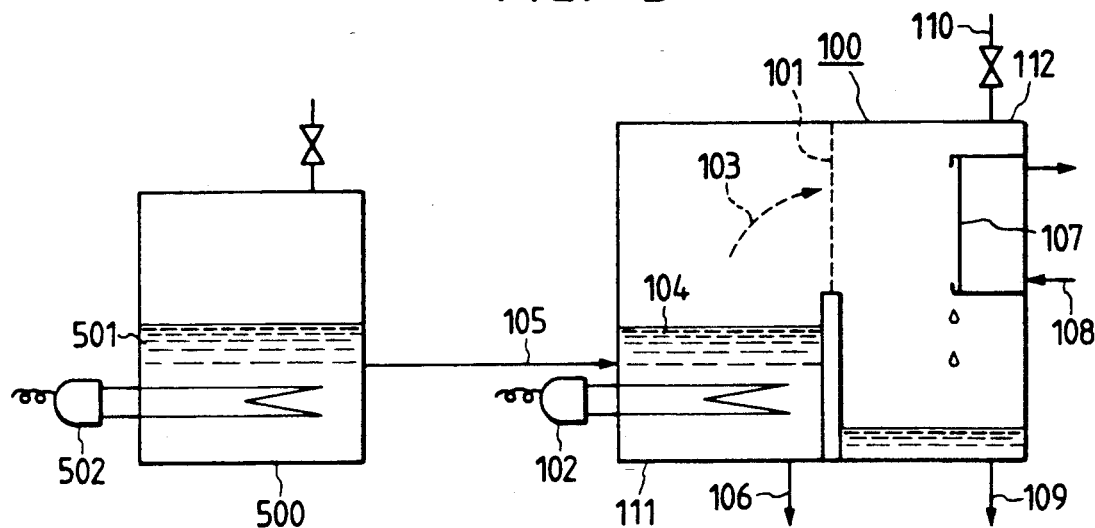
FIG. 5 is a schematic diagram of a washing apparatus of another embodiment of the present invention.

FIG. 5 shows a vapor washing apparatus in which a volatile component removing section 500 is added to a vapor washing apparatus as shows in FIG. 1.

Raw water 501 is sent to a steam generation section 111, and heated and boiled by a heater 502. Volatile components contained in the raw water are separated, and then the raw water is sent to the steam generation section 111 through a water inlet 105. Although removal time of the volatile components depends on the quantity of the raw water, the volatile components can be removed by boiling the water for a time of from ten and several minutes to several tens of minutes.

EXAMPLE 6

Figure 6:
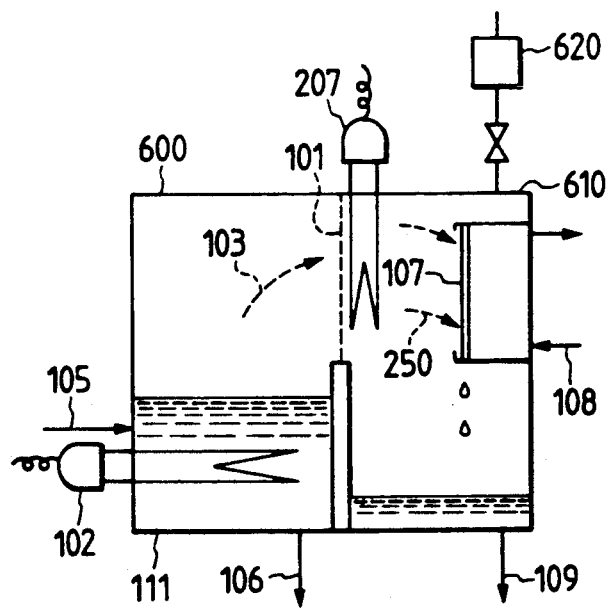
FIG. 6 is a schematic diagram of a washing apparatus of another embodiment of the present invention.

FIG. 6 shows a vapor washing apparatus which is provided with a vacuum exhaust port in a washing-drying section.

The vapor washing apparatus has a heater 207 for superheating and a vacuum pump 620 added to the washing apparatus of FIG. 1.

In this example, during steam washing, a raw water is heated by a heater 102 to generate steam 103. The steam permeates a hydrophobic porous membrane 101 to separate the mist, and then contacts an object 107 to be washed and condenses, whereby the object is washed with condensed water. After finishing off the washing, a heater 207 for superheating is operated in addition to a heater 102 to raise a temperature of the steam permeated through the porous membrane 101 to a temperature higher than a boiling point.

Further, in this example, although the heater 207 for superheating is disposed in a washing-drying section 610, it can be disposed in the steam generation section as shown in FIG. 3. The superheated steam 250 has a function of gasifying the condensed water on the object to be washed and drying it. However, water separation is not sufficient by drying only with the superheated steam, so that the washing drying section 610 is depressurized by a vacuum pump 620 in a drying step, whereby water drops on the surface of the object to be washed are more easily dispersed and sufficiently separated from the object surface.

In any of the above-mentioned examples, water is used as a washing liquid, however, an organic solvent or a chemical solution can be used as the washing liquid.

EXAMPLE 7

In the case of an object to be washed being contaminated with greasy or fatty substances, oxides such as $SiO_2$, or in case the object has very fine grooves formed on a surface thereof, it is preferable to additionally provide the present invention with the following pre- or post-treatment of the vapor washing.

Figure 7:
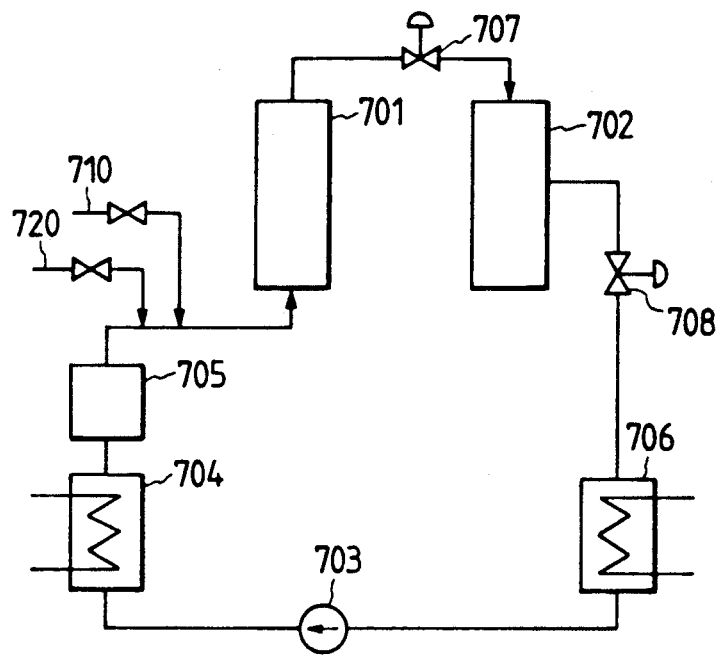
FIG. 7 is a schematic diagram of a washing apparatus applicable for any of the above-mentioned embodiments.

FIG. 7 shows an apparatus for practicing the pre- or post-treatment having a recirculation line 700 provided with first and second containers 701 and 702, and pressure regulation valves 707 and 708 at downstream sides of the containers 701, 702, respectively. The line 700 is further provided with a pump 703 for recirculation of the fluid in the line, a cooler 706, a heater 704 and a filter 705 at an upstream side of the first container 701. Further, in the line 700 between the first container 701 and the filter 705, an inlet 710 for reactive gas such as HF and an inlet 720 for $H_2O$ are provided.

In this line 700, a contaminated object to be treated such as semiconductor a wafer is accommodated in the first container 701 to remove the contamination of the object by a super critical fluid introduced therein, and then the fluid is introduced into the second container 702. In the second container 702, impurities contained in the fluid are removed therefrom through reduction in pressure of the container 702 and separation of the impurities. This operation will be explained in detail.

In order to easily transfer a fluid in the recirculation line 700, the cooler 706 is provided and cools gas from the second container 702 to a temperature less than a saturated temperature under the pressure of the gas to form liquid. The liquid transmitted to the heater 704 is raised in pressure and temperature above the critical point and made into a super critical fluid state. The pump used here can be replaced by a gas compressor which can compress a gas from a gas condition less than the critical point to a super critical fluid condition. In this case, the cooler is unnecessary. The filter 705 catches impurities in the super critical fluid to prevent the impurities from entering the first container 701.

Thus formed and cleaned super critical fluid is introduced into the first container 701. Reactive gas such as HF which is preferable for removing native $SiO_2$ of the wafer is introduced in the line from the inlet 710 to mix with the super critical fluid. As the super critical fluid, $CO_2$ (gas the critical temperature of which is close to that of HF and the boiling point of which is about 29° C.) is suitable from a point of view of operation, safety, economy. $H_2O$ from the inlet 720 is added to the super critical fluid, whereby wetability of the super critical fluid or a mixture of the super critical fluid and HF gas is elevated, whereby the affinity on the surface of the wafer contained in the first container 701 is raised, so that various kinds of contamination are effectively removed from the fine grooves.

Figure 8:
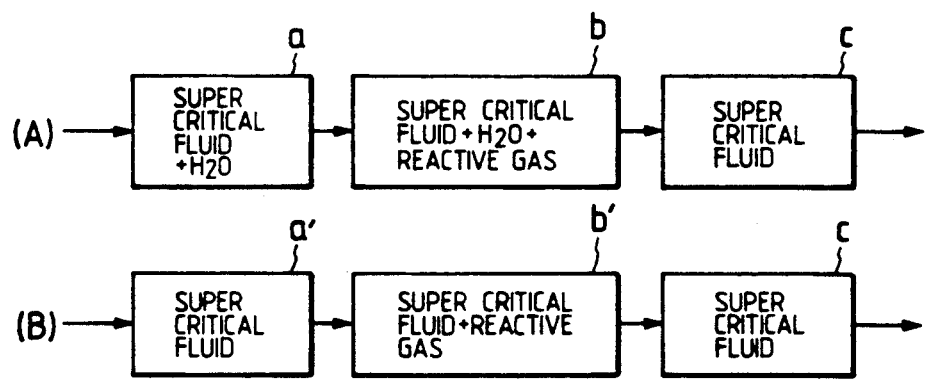
FIGS. 8(A) and 8(B) show a diagram for explaining the apparatus shown in FIG. 7.

This removal operation is effected by changing step by step the fluid condition in the first container 701, so that the wafer to be treated will be cleaned, with contamination being removed. Namely, as shown in FIG. 8, in a cleaning process (A) in which both $H_2O$ and a reactive gas are added to the super critical fluid, the first container 701 is maintained in three conditions (a), (b) and (c). In the first condition (a), the first container 701 is maintained so that the super critical fluid and $H_2O$ mixed with the super critical fluid and organic contamination, such as fatty substances, are removed. In the second condition (b), the first container 701 is maintained so that the super critical fluid, $H_2O$ and reactive gas such as HF and native $SiO_2$ are removed from the wafer, and in the third condition (c), the first container 701 is maintained so that only the super critical fluid and a small amount of wetness on the wafer are removed to make the wafer in a dry condition.

In a cleaning process (B), the first container 701 also is maintained in three conditions (a'), (b') and (c). The conditions (a') and (b') of the container 701 are the same as the above mentioned conditions (a') and (b'), respectively, except that $H_2O$ is not added.

In both the cleaning processes (A) and (B), when the first container 701 is in the condition (c) immediately before the cleaning of the wafer is finished, in the first container 701, only $CO_2$ gas and the wafer cleaned exist so that the clean wafer can be safely taken out by opening the first container 701. In this manner, contamination whose removal is intended can be removed step by step only by changing the condition surrounding the wafer in the first container 701.

The super critical fluid used for cleaning the contamination of the wafer is introduced into the second container 702. In the second container 702, the super critical fluid is depressurized or reduced in temperature so that the super critical fluid turns to gas of an ordinary condition. The gas in the depressurized condition is reduced in solubility, so that contamination, $H_2O$, etc. solved in the super critical fluid is separated from the gas by changing the super critical fluid into a gas.

The pressure in the second container 2 is reduced less than the critical point of the gas and less than the boiling point of the reactive gas, whereby sufficient separation is achieved.

Only $CO_2$ gas is transferred to the cooler, and liquefied $CO_2$ is used again for removal of the contamination.

By using the apparatus in which the recirculation line, in particular, the interior of the first and second containers 701, 702 are covered with fused silicon (Si) layers, Si wafer of 2 inches were cleaned. The cleaned Si wafer is taken out and pure water was dropped on the cleaned Si wafer. As a result, the Si wafer presented hydrophobicity, contaminations including native $SiO_2$ were removed and a pure Si wafer was obtained. Incidentally, Si wafer from which fatty substances are removed and which is disposed to atmosphere to form native $SiO_2$ presented an affinity for water. According to this example, treatment from the cleaning or washing to the drying can be effected in the same container using the super critical fluid, so that the treated object can be transferred to the next production step without producing dust or bringing them into the product. Further, this cleaning treatment is effective to clean an object having fine parts on the order of a submicron.

What is claimed is:

1. A process of washing an object to be treated with vapor, wherein the improvement comprises the steps of:
   removing mist accompanying the vapor by a porous membrane;
   contacting the vapor with the object to be treated and condensing the vapor thereon; and then
   separating the condensed vapor from the object to be treated.

2. A process of washing an object to be treated with vapor, comprising the steps of:

passing steam through a hydrophobic porous membrane thereby to remove mist accompanying the steam;

contacting the steam after passing through said hydrophobic porous membrane with an object to be treated and condensing the steam thereon; and separating the condensed steam from the object to be treated.

3. A process of washing an object to be treated with vapor, wherein the improvement comprises the steps of:

removing mist accompanying the vapor by a porous membrane; and then contacting the vapor with the object to be treated and condensing the vapor thereon, wherein vapor of an organic solvent insoluble to water is used as said vapor and a hydrophilic porous membrane is used as said porous membrane for removing mist in the vapor therefrom.

4. A process of washing an object to be treated with vapor, comprising the steps of:

heating liquid to generate vapor;

passing the vapor through a porous membrane thereby to remove mist accompanying the vapor;

contacting the vapor with an object to be treated and condensing the vapor thereon, whereby the object is washed with the condensed vapor; and then separating the condensed vapor from the object.

5. A process of washing an object with vapor, comprising the steps of:

heating water to generate steam as the vapor;

causing the steam to permeate a hydrophobic porous membrane, thereby removing mist from the steam;

contacting the steam from which the mist has been removed with an object to be treated and condensing thereon, whereby the object is washed with the condensed steam; and then separating the condensed steam from the object.

6. A process of washing an object to be treated with vapor, comprising the steps of:

heating liquid to generate vapor;

passing the vapor through a porous membrane thereby to remove mist accompanying the vapor; and then contacting the vapor with an object to be treated and condensing the vapor thereon, whereby the object is washed with the condensed vapor, wherein a pretreatment of removing volatile components from said liquid is effected prior to said step of heating liquid.

7. A process of washing an object with vapor, comprising the steps of:

heating water to generate steam as the vapor;

causing the steam to permeate a hydrophobic porous membrane, thereby removing mist from the steam; and then contacting the steam with an object to be treated and condensing thereon, whereby the object is washed with the condensed steam, wherein a pretreatment of boiling the water is effected prior to said step of heating water to remove volatile components from the water.

8. A process of washing an object to be treated with vapor, wherein the improvement comprises the steps of:

removing mist accompanying the vapor by a porous membrane; and then contacting the vapor with the object to be treated and condensing the vapor thereon, wherein said vapor contacting step is effected while forcibly cooling a surface of the object to such a temperature that the vapor condenses on the surface of the object.

9. A process of washing an object with vapor, said process comprising the steps of:

removing mist accompanying vapor by passing the vapor through a porous membrane;

washing an object by contacting the vapor separated from mist with the object and condensing the contacted vapor on a surface of the object; and then heating the vapor to generate superheated vapor; and drying the washed object by contacting the washed object with the superheated vapor.

10. A process of washing an object with vapor, comprising the steps of:

removing mist accompanying the vapor by passing the vapor through a porous membrane;

heating the vapor having passed through the porous membrane to a temperature higher than the boiling point thereby to generate superheated vapor;

washing an object with the superheated vapor by contacting the object with the superheated vapor and condensing the superheated vapor on a surface of the object; and drying the washed object by contacting the object with the superheated vapor.

11. The process according to claim 1, wherein said step of contacting the vapor with the object and condensing the vapor thereon is effected while keeping the surrounding of the object to be treated at a saturated state of the vapor.

12. The process according to claim 9, wherein said drying step includes a step of depressurizing the surrounding of the object to be treated to disperse condensed vapor adhered on the surface of the object.

13. A process of washing an object to be treated with vapor, wherein the improvement comprises the steps of:

removing mist accompanying the vapor by a porous membrane; then contacting the vapor with the object to be treated and condensing the vapor thereon; and drying the washed object by rotating the washed object and dispersing the condensed vapor adhered on the surface of the object by centrifugal force caused by the rotation.

14. The process according to claim 9, wherein said drying step includes dispersion of condensed vapor adhered on a surface of the washed object by centrifugal force caused by spinning the washed object.

15. The process according to claim 9, wherein in said step of heating the vapor, the vapor subjected to said washing step is heated to generate the superheated vapor.

16. A process of washing a semiconductor wafer, which has been treated with chemical solution, with vapor, said process comprising the steps of:

heating ultra-pure water to generate steam;

removing mist from the steam by passing the steam through a hydrophobic porous membrane; and then washing the wafer by contacting the steam with the wafer and condensing the steam thereon.

17. A process of washing an object with vapor, comprising the steps of:

heating water to generate steam;

causing the steam to permeate a hydrophobic porous membrane, thereby removing mist from the steam; and then contacting the steam with an object to be treated and condensing thereon, whereby the object is washed with the condensed steam, wherein said object to be treated is a magnetic disc.

18. A process of washing an object with vapor, comprising the steps of:

heating water to generate steam;

causing the steam to permeate a hydrophobic porous membrane, thereby removing mist from the steam; and then contacting the steam with an object to be treated and condensing thereon, whereby the object is washed with the condensed steam, wherein said object to be treated is an optical disc.

19. A process of washing a semiconductor wafer with vapor, comprising:

passing vapor through a porous membrane to separate mist accompanying the vapor, contacting the vapor from which the mist has been removed with the semiconductor wafer, and condensing the vapor thereon, and further performing:

a first step of contacting the semiconductor wafer with a super critical fluid to extract contamination from the semiconductor wafer;

a second step of contacting the semiconductor wafer with a mixture of the super critical fluid and a reactive gas added to the semiconductor wafer to further extract contaminations from the semiconductor wafer; and a third step of drying the semiconductor wafer by contacting the wafer with a super critical fluid.

20. The process according to claim 19, wherein said super critical fluid is formed of an inert gas.

21. The process according to claim 19, wherein said mixture is reactive to native oxides adhered to the semiconductor wafer.

22. The process according to claim 19, wherein in said first and second steps, steam is added to the super critical fluid and the mixture, respectively.

23. A vapor washing apparatus, comprising:

means for generating vapor;

means for removing mist accompanying the vapor;

means for contacting the vapor separated from mist with an object to be treated and condensing the vapor thereon, whereby the object is washed with the condensed vapor; and means for separating the condensed vapor from the object.

24. A vapor washing apparatus comprising:

a vapor generation section having a bath for containing a washing liquid and a heater for heating the washing liquid in said bath to generate vapor;

a condensing and washing section in which the vapor contacts with an object to be treated and condenses thereon, whereby the object is washed; and a separation disposed between and partitioning said vapor generation section and said condensing and washing section, said separation comprising a porous membrane for separating mist accompanying the vapor directed to said condensing and washing section from the vapor.

25. The vapor washing apparatus according to claim 24, wherein said apparatus further includes means for cooling a surface of the object in said condensing and washing section to a temperature at which the vapor contacted on the object can condense.

26. The vapor washing apparatus according to claim 24, wherein said apparatus further includes a spinner disposed in said condensing and washing section for rotating the object to disperse liquid drops from the surface of the object to be treated.

27. The vapor washing apparatus according to claim 24, further including means for depressurizing said condensing and washing section.

28. The vapor washing apparatus according to claim 24, further including means for extracting uncondensable gas to keep said condensing and washing section at a saturated state of vapor during the washing.

29. The vapor washing apparatus according to claim 24, further including means for heating the vapor to keep the condensing and washing section at a temperature higher than the boiling point.

30. An apparatus for washing a semiconductor wafer, comprising:

means for separating vapor from mist accompanying the vapor by a porous membrane and means for contacting a semiconductor wafer with the vapor for washing, said apparatus further including:

a first washing means for contacting the semiconductor wafer with a super critical fluid to wash the semiconductor wafer therewith;

a second washing means for contacting the semiconductor wafer with a mixture of the super critical fluid and a reactive gas; and means for removing wetness of the semiconductor wafer by contacting the semiconductor wafer with a super critical fluid.

31. The apparatus according to claim 30, further including means for adding steam to said first and second washing means.

32. An apparatus for washing a semiconductor wafer, comprising:

means for separating vapor from mist accompanying the vapor by a porous membrane and means for contacting a semiconductor wafer with the vapor for washing, said apparatus further including:

a first container for containing a semiconductor wafer; a reactive gas, means for selectively introducing a super critical fluid, a reactive gas and steam into said first container;

a second container fluidly connected to said first container for receiving fluid including the super critical fluid and the reactive gas from said first container, said second container having means for depressurizing the second container so as to precipitate contaminations included in the super critical fluid; and recirculating means for recirculating fluid via said first and second containers.

33. The apparatus according to claim 32, wherein the interior walls of said first and second container and said circulation means are formed of films noncorrosive to said reactive gas.

34. A process of washing an object to be treated with vapor according to claim 1, wherein the object to be treated is one of an electrical and semiconductor part.

35. A process of washing an object to be treated with vapor according to claim 2, wherein the object to be treated is one of an electrical and semiconductor part.

36. A process of washing an object to be treated with vapor according to claim 4, wherein the object to be treated is one of an electrical and semiconductor part.

37. A process of washing an object to be treated with vapor according to claim 5, wherein the object to be treated is one of an electrical and semiconductor part.

38. A vapor washing apparatus, comprising:
means for generating vapor;
means for removing mist accompanying the vapor, said means having a porous membrane for passing the vapor therethrough, said porous membrane allowing the vapor to pass through and preventing the mist accompanying the vapor from passing therethrough;
means for contacting the vapor separated from mist with one of an electrical and semiconductor part and condensing the vapor thereon, whereby the part is washed with the condensed vapor; and
means for separating the condensed vapor from the part.

* * * * *